(12) United States Patent
Tanaka et al.

(10) Patent No.: US 6,238,953 B1
(45) Date of Patent: May 29, 2001

(54) LEAD FRAME, RESIN-ENCAPSULATED SEMICONDUCTOR DEVICE AND FABRICATION PROCESS FOR THE DEVICE

(75) Inventors: Kenzo Tanaka; Takahiro Yotsumoto, both of Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/480,257

(22) Filed: Jan. 11, 2000

(30) Foreign Application Priority Data

Jan. 12, 1999 (JP) ............................................. P11-005123

(51) Int. Cl.⁷ ........................... H01L 21/44; H01L 23/495
(52) U.S. Cl. ........................ 438/112; 438/123; 257/669; 257/670
(58) Field of Search ..................................... 438/111, 112, 438/123; 257/669, 670, 674, 676

(56) References Cited

U.S. PATENT DOCUMENTS

| | | | |
|---|---|---|---|
| 5,903,048 | * | 5/1999 | Bandou et al. ...................... 257/670 |
| 5,910,681 | * | 6/1999 | Kozono ................................. 257/676 |
| 5,969,411 | * | 10/1999 | Kukaya ................................. 257/676 |
| 6,013,946 | * | 1/2000 | Lee et al. ............................. 257/666 |
| 6,034,423 | * | 3/2000 | Mostafazadeh et al. ............ 257/676 |

* cited by examiner

*Primary Examiner*—Kevin M. Picardat
(74) *Attorney, Agent, or Firm*—Ronald P. Kananen; Rader, Fishman & Grauer

(57) ABSTRACT

Fabrication of a semiconductor device, with an improved level of exposure of the rear surface of a die pad is enabled during the fabrication of which deformation of a die pad in a resin-encapsulating step is prevented from occurring, and which can be mounted on a printed wiring board with a sufficient soldering strength. In a resin-encapsulated semiconductor device in which a semiconductor element is placed on the front surface of a die pad of a lead frame including: the die pad; and support bars of the die pad that protrude outwardly from sides of the die pad, the semiconductor element and its periphery are encapsulated with a resin material while the rear surface of the die pad is exposed to the external environment, a groove is formed on the rear surface of the support bar so that the groove traverses the support bar in the neighborhood of the boundary between the support bar and the die pad along a direction intersecting a protruding direction of the support bar. The groove may be formed on the front surface of a support bar.

4 Claims, 2 Drawing Sheets

LEAD FRAME, RESIN-ENCAPSULATED SEMICONDUCTOR DEVICE AND FABRICATION PROCESS FOR THE DEVICE

BACKGROUND OF THE INVENTION

1. Field of Invention

The present invention relates to a lead frame, a resin-encapsulated semiconductor device and a fabrication process for the device and particularly, to a lead frame that is applied to a semiconductor element, the element and its periphery being resin-encapsulated while the rear surface of a die pad is exposed to the external environment, an resin-encapsulated semiconductor device and a fabrication process for the device.

2. Description of Related Art

There have been known a conventional resin-encapsulated semiconductor device (a resin-encapsulater semiconductor device will hereinafter be referred to as a semiconductor device) in which the rear surface of a die pad is exposed to the external environment, for example, as shown in FIG. 4, which is a perspective view of appearance of the semiconductor device as viewed from the front side thereof, in FIG. 5, which is a perspective view of appearance of the semiconductor device as viewed from the rear side thereof and in FIG. 6, which is a sectional view taken on line II—II of FIG. 4.

That is, the semiconductor device 10 comprises a lead frame 11 including: a die pad 12; support bars 13 that are protruded outwardly from sides of the die pad 12; inner leads 14; and outer leads 15, wherein the constituents are separated from frame selvages each having a band like shape.

Not only is a semiconductor element (a semiconductor chip) 16 made to firmly adhere to a surface of the die pad 12 of the lead frame 11 with silver paste applied therebetween, but electrodes (not shown) of the semiconductor element 16 are respectively connected to the inner leads 14 using gold wires 17. Further, the semiconductor element 16 is packaged with a construction in which an encapsulating section 18 made of a resin material that encapsulates the semiconductor device 16 and its periphery is formed while the outer leads 15 and the rear surface of the die pad 12 are both exposed to the external environment.

In fabrication of the semiconductor device 10, though not shown in the figures, the lead frame is provided which comprises the die pad 12, bar supports 13 and inner leads 14 all of which are formed in an opening inside the frame selvages having a band-like shape, and the outer leads 15 that are connected to the frame selvages. At first, the semiconductor element 16 is made to firmly adhere to a surface of the die pad of the lead frame with silver paste.

Following the adhesion of the element, the electrodes of the semiconductor element 16 and the inner leads 14 are connected by the gold wires 17 and thereafter, the semiconductor element 16 and the periphery thereof are encapsulated with a resin material while the outer leads 15 and the rear surface of the die pad 12 are exposed to the external environment, so that the device is packaged. Further, the outer leads 15 are press cut using a dedicated lead shaping metal mold so as to be separated from the frame selvage, thereby completing the semiconductor device 10.

This fabricated semiconductor device 10 is mounted on a printed wiring board by soldering the rear surface of the die pad 12 and part of the outer leads 15, which are exposed to the external environment, to the printed wiring board to obtain a printed circuit board. In the semiconductor device 10 mounted on the printed wiring board, since the rear surface of the die pad 12 is directly soldered on the printed wiring board, heat that the semiconductor element 16 generates can be dissipated through the die pad 12 and the printed circuit board.

In a conventional semiconductor device 10 in which the rear surface of the die pad 12 is exposed to the external environment, however, the rear surface of the die pad 12 and the rear surface of the encapsulating section 18 made of a resin material are formed to be coplanar with each other. Hence, in a resin-encapsulating step of semiconductor device 10 fabrication, a flash 19 of the resin material can have a chance to generate on the rear surface of the die pad as shown in FIG. 5 by an encapsulation pressure.

That is, in the resin encapsulating step, the lead frame on which the semiconductor element 16 is mounted and which is still in one piece with the frame selvage is disposed in a cavity formed by a pair of an upper metal mold half and a lower metal mold half in assembly, for example, so that the rear surface of the die pad 12 is oppositely in direct plane contact with the top surface of the lower meal mold half with no resin material covering the rear surface of the die pad 12. Further, outside the periphery of the die pad 12 in such an arrangement, a space is formed in which the resin material can be filled up to the top surface of the lower metal mold half at a position where the rear surface of the die pad is located.

On the other hand, when a lead frame is clamped by the upper and lower metal mold halves, a strain that works to deform the die pad 12 is imposed on the die pad 12 through the support bars 13 of the lead frame, thereby entailing deformation of die pad 12. Therefore, the flash 19 of the resin material occurs on the rear surface of the die pad 12 by an encapsulating pressure when the resin material is injected into the cavity. It should be noted that while description is herein made of the example in which the rear surface of the die pad 12 is put into plane contact with the top surface of the lower metal mold half, another encapsulating metal mold may also be adopted in the encapsulation in which, contrary to this example, the rear surface of the die pad 12 is put into plane contact with the top surface of the upper encapsulating metal mold half wherein the lead frame is placed in the cavity of the mold interchanging positions of the upper and lower sides. In the latter case as well, similar to the former case, a flash 19 of the resin material generates on the rear surface of the die pad 12 by an encapsulating pressure.

If such a flash 19 of a resin material onto the rear surface of the die pad 12 occurs, an exposure area of the rear surface of the die pad 12 is reduced and thereby a level of exposure is lowered. Therefore, when the semiconductor device 10 is actually mounted on a printed wiring board, the rear surface of the die pad 12 is raised while being separated from the mounting surface of the printed wiring board in the portion corresponding to the flash 19 and an inconvenience occurs because of reduction in mechanical strength of a soldered joint, decrease in heat dissipation and others. As a result, problems arise because of reduction in reliability of an electronic component fabricated with the device and a poor production yield thereof.

Further, in a case where the semiconductor device 10 is actually mounted on a printed wiring board, there are two ways: the die pad 12 and the support bars 13 for the die pad 12 are both soldered to the printed wiring board and one of the die pad 12 and the support bars 13 is soldered thereto. However, since the rear surfaces of the die pad 12 and the support bars 13 are coplanar with each other, if the latter case is selected and, for example, only the support bars 13 are soldered, the solder on the support bars 13 flows out to the die pad 12 side with the result that an inconvenience also arises since a sufficient mechanical strength of the soldered joint cannot be attained.

SUMMARY OF THE INVENTION

Accordingly, there has been a strong demand for development in technique that enables fabrication of a semiconductor device with an improved level of exposure of the rear surface of a die pad, of which fabrication deformation of a die pad in a resin-encapsulating step is prevented from occurring, and which the device can be mounted on a printed wiring board with a sufficient soldering strength.

Therefore, in order to solve the problem, a lead frame according to the invention comprises a frame selvage provided with an opening; a die pad that is disposed in the opening and on whose front surface a semiconductor element is placed; and a support bar that is provided in the opening while protruding from a side of the die pad toward a frame selvage, wherein a groove is formed on at least one of the front and rear surfaces of the support bar so that the groove traverses the support bar in the neighborhood of the boundary between the support bar and the die pad along a direction intersecting a protruding direction of the support bar.

Since a groove is formed on at least one of the front and rear surfaces of a support bar of the lead frame in the invention when a semiconductor element is placed on the front surface of the die pad of the lead frame and the lead frame is clamped with a metal mold in order to encapsulate the semiconductor element and the periphery thereof with a resin material, even if a strain that works so as to deform the die pad and that is caused by the clamping is imposed on the lead frame, the strain is alleviated through dispersion of the stress by the groove. Therefore, even if resin encapsulation is effected while the rear surface of the die pad, which surface is exposed to the external environment, and an encapsulating section (package section) made of the resin material are coplanar with each other, deformation of the die pad is prevented from occurring and no flash of the resin material as generated onto the rear surface of the die pad due to an injection pressure.

Further, since a groove is formed on the support bar so that the groove traverses the support bar in the neighborhood of the boundary between the support bar and the die pad along a direction intersecting a protruding direction of the support bar, if the groove is formed on the rear surface of the support bar, the groove is also filled with the resin material in fabrication of a resin-encapsulated semiconductor device in which a lead frame of the present invention is used and the rear surface of the die pad is exposed to the external environment. As a result, since the rear surface of the support bar and the rear surface of the die pad are in a state in which both rear surfaces are separated from each other, solder is prevented from flowing out from one of the rear surfaces of a die pad and support bar of the semiconductor device, thus fabricated, to the other when the one of the rear surfaces of a die pad and support bar of the semiconductor device is soldered on a printed wiring board.

A resin-encapsulated semiconductor device according to another aspect. The invention has a construction in which a semiconductor element is placed on the front surface of a die pad of a lead frame that includes a die pad and a support bar of the die pad, which support bar protrudes outwardly from a side of the die pad, and the semiconductor element and the periphery thereof are encapsulated with a resin material while the rear surface of the die pad is exposed to the external environment, wherein a groove is formed on the support bar in a similar way to the invention described above.

Since, as in the above described invention, a groove is formed on a support bar in this invention, even if a stress that works so as to deform the die pad and that is caused by clamping is imposed on the lead frame, the stress is alleviated by the groove to prevent deformation of the die pad from occurring, when the lead frame is clamped with a metal mold in order to encapsulate the semiconductor element and the periphery thereof using a resin material in fabrication of the semiconductor device. Hence, no flash generates onto the rear surface and thereby, a resin-encapsulated semiconductor device in which the exposure area is ensured is realized. Further, since a groove of a support bar is provided, similar to the main features of the invention, if the groove is formed on the rear surface of the support bar, solder is prevented from flowing out from one of the rear surfaces of a die pad and support bar of the semiconductor device to the other when the one of the rear surfaces of a die pad and support bar of the semiconductor device is soldered on a printed wiring board.

A fabrication process for a resin-encapsulated semiconductor device according to another aspect of the invention uses a lead frame of the basic invention, and in the process, a semiconductor element is placed on the front surface of the die pad of the lead frame and subsequent to placement of the semiconductor element, a semiconductor element and the periphery thereof are resin encapsulated using an encapsulation metal mold while the rear surface of the die pad is exposed to the external environment.

Since a semiconductor element and the periphery thereof are encapsulated using a lead frame of the invention included in claim 1 on whose support bar a groove is formed, while the rear surface of the die pad is exposed to the external environment, a stress that is imposed on the lead frame in resin-encapsulation is alleviated by the groove in a similar way to the main features of the invention, which in turn, prevents deformation of the die pad from occurring with the result that fabrication of a resin-encapsulated semiconductor device in which an exposure area of the rear surface of the die pad is ensured is made possible. Further, when a lead frame, a support bar of which has a groove formed on its rear surface, is used, since the groove is also filled with a resin material and thereby, the rear surfaces of the support bar and die pad are in a separated state, fabrication of a resin-encapsulated semiconductor is made possible in which solder is prevented from flowing out from one of the rear surfaces of a die pad and support bar of the semiconductor device to the other when the one of the rear surfaces of a die pad and support bar of the semiconductor device is soldered on a printed wiring board.

DESCRIPTION OF THE PREFERRED EMBODIMENTS

Figure 1A:
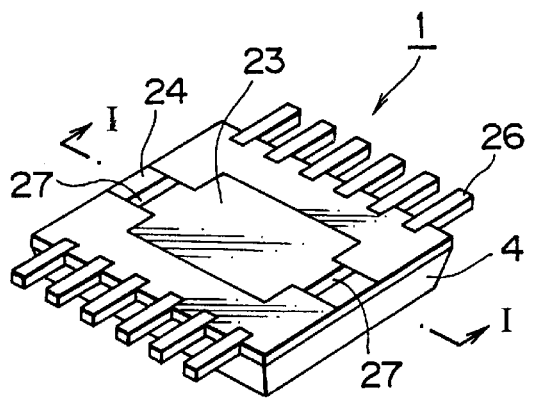
FIGS. 1A and 1B are views showing an embodiment of a resin-encapsulated semiconductor device according to the invention included in claims 2 and 3 and FIG. 1A is a perspective view of appearance of the semiconductor device of the embodiment as viewed from the rear side and FIG. 1B is a sectional view taken on line I—I of FIG. 1A.
Figure 1B:
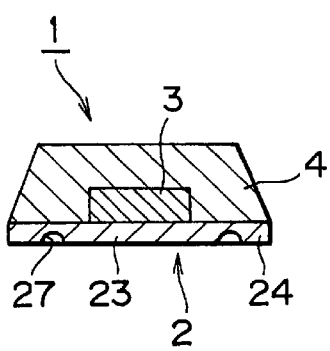

Next, embodiments of the present invention will be described based on the accompanying drawings:

FIGS. 1A and 1B are views showing an embodiment of a resin-encapsulated semiconductor device (hereinafter simply referred to as "semiconductor device") according to the invention in which, FIG. 1A is a perspective view of the appearance of the semiconductor device of the embodiment as viewed from the rear side and FIG. 1B is a sectional view taken on line A—A of FIG. 1A. Further, FIG. 2 is a perspective view showing a main part of an embodiment of a lead frame according to the invention wherein the lead frame is used for fabrication of the semiconductor device 1 shown in FIGS. 1A and 1B, for example.

Figure 2:
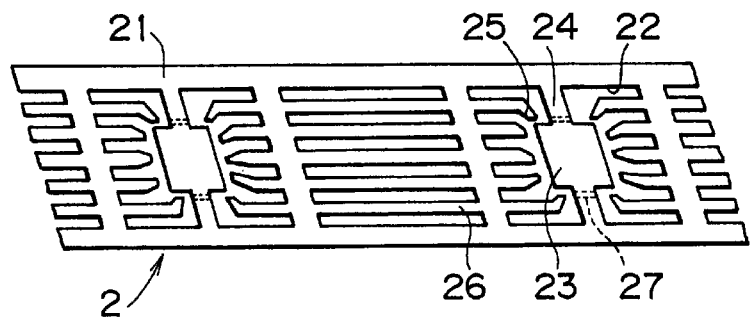
FIG. 2 is a perspective view showing a main part of an embodiment of a lead frame according to the invention.

In a lead frame 2 according to the embodiment, as shown in FIG. 2, openings 22 in the shape of a near rectangle are formed along a length direction of a band like frame selvages 21. The selvages 21 are made of Cu or an alloy such as pains thereof "42 alloy" in predetermined distances between adjacent and a die pad 23 is formed in each opening 22. The die pad 23 also has the shape of a near rectangle and support bars 24 for the die pad 23 are provided so that the bars 24 protrude from one pair of two opposite sides of the die pad 23 toward the frame selvages 21.

Further, two sets of a plurality of inner leads 25 are protruded inwardly from two opposite sides of the opening 22 inside the frame selvages 21 while each of one set of the plurality of inner leads 25 on one side of the opening 22 directs its distal end to the opposite side thereof. In addition, two sets of a plurality of outer leads 26 are formed on the outsides of the two sets of a plurality of inner leads 25 respectively in a corresponding manner.

Grooves 27, which are a feature of the present invention, are respectively formed on the rear surface of the support bars 24 for the die pad 23. A groove 27 traverses a support bar 24 in the neighborhood of the boundary between the support bar 24 and the die pad 23 along a direction intersecting a protruding direction of the support bar 24. In the embodiment, the support bar 24 has a narrow, long shape and the groove 27 extends across the entire width of the support bar 24.

Next, an example of a fabrication process for a semiconductor device according to the invention will be described based on a case where the semiconductor 1 is fabricated using such lead frame 2.

In a fabrication process of the embodiment, as shown in FIG. 1A, the lead frame 2 having the grooves 27 is employed and a semiconductor element (semiconductor chip) 3 is made to firmly adhere to the surface of the die pad 23 with silver paste applied therebetween. Following this, electrodes of the semiconductor element 3 and the inner leads 25 are respectively connected therebetween with wires such as gold wires, which are not shown in the figure.

Figure 3:
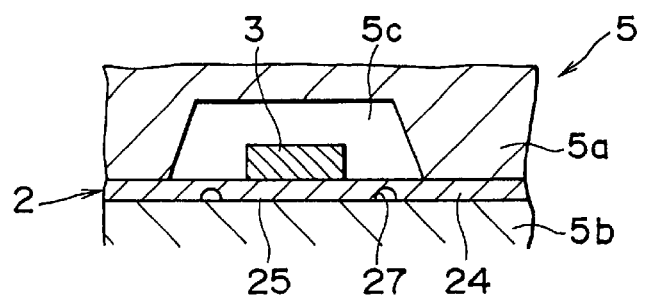
FIG. 3 is a view showing a step of a fabrication process for a resin encapsulated semiconductor device according to the invention.
Figure 4:
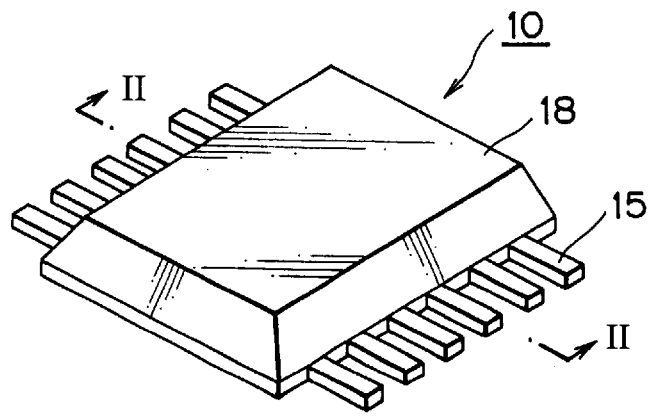
FIG. 4 is a perspective view of appearance of a conventional resin-encapsulated semiconductor device as viewed from the front side.
Figure 5:
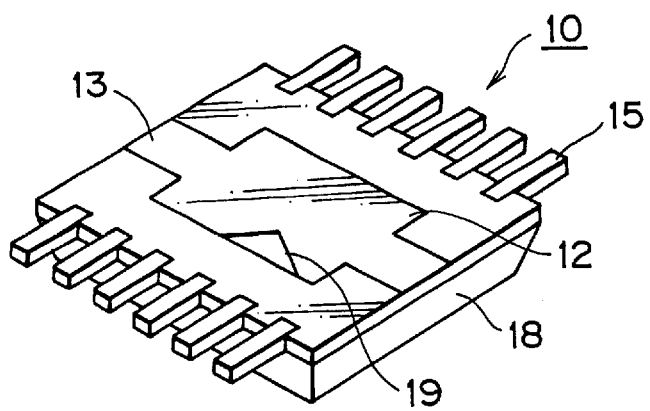
FIG. 5 is a perspective view of appearance of a conventional resin-encapsulated semiconductor device as viewed from the rear side.
Figure 6:
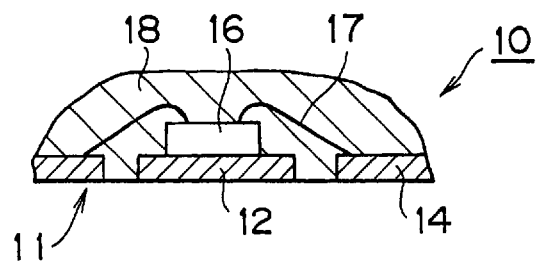
FIG. 6 is a sectional view taken on line II—II of FIG. 4.

After the connection, as shown in FIG. 3, which is a sectional view illustrating a resin encapsulating step, the lead frame 2 is placed in an encapsulating metal mold 5 assembled with an upper metal mold 5a and lower metal mold 5b so that the semiconductor element 3 is positioned inside a cavity 5c of the encapsulating metal mold 5; the semiconductor element 3 and the periphery thereof are encapsulated with a resin material while the outer leads 26 and the rear surface of the die pad 23 are exposed to the external environment, thereby forming an encapsulating section 4 made of the resin material.

In the encapsulating step, the encapsulation is conducted while the lead frame 2 is disposed such that the rear surface of the die pad 23 is put in plane contact with the top surface of the lower metal mold 5b and in this state, a space is formed outside the periphery of the die pad 23 in which space the resin material is filled up to the top surface of the lower metal mold 5b at the position of the rear surface of the die pad 23, and which space communicates with the grooves 27 which are formed on the rear surfaces of the support bars 24. Hence, the grooves 27 are also filled with the resin material in the encapsulating step.

Subsequent to the encapsulating step, the outer leads 26 are press cut using a dedicated lead shaping metal mold to separate them from the frame selvages 21. Through the above described steps, the semiconductor device 1 shown in FIG. 1 is fabricated, which includes: the lead frame 2 constructed of the die pad 23, support bars 24, inner leads 25 and outer leads, wherein the grooves 27 are formed on the rear surfaces of the support bars 24 and the resin material is filled in the grooves 27; the semiconductor element 3 mounted on the front surface of the die pad 23; wires which connect the electrodes (not shown) of the semiconductor device 3 and the inner leads 25 thereby; and the encapsulating section 4 made of the resin material in which section the semiconductor element 3 and its environmental space including the inner leads 25 are encapsulated with the resin material in one piece, while the outer leads 26 and the rear surface of the die pad 23 are exposed to the external environment.

In the semiconductor device 1 and the lead frame 2 thereof of the embodiment, since the grooves 27 are formed on the rear surfaces of the support bars 24 as described above, even if a strain that works so as to deform the die pad 23 and that is caused by the clamping is imposed on the lead frame 2 when the lead frame 2 is clamped in the resin encapsulating step of fabrication of the semiconductor device 1, the strain can be alleviated being dispersed by the grooves 27. Accordingly, since deformation of the die pad 23 can be prevented from occurring and thereby, a flash of the resin material onto the rear surface of the die pad 23 caused by an encapsulating pressure is avoided, which can ensures an exposure area in the rear surface of the die pad 23 and can improve a level of exposure thereof.

Further, in the semiconductor device 1, since the grooves of the support bars 24 each are formed in the neighborhood of the boundary between a support bar 24 and the die pad 23 so as to traverse the support bar 24 along an intersecting direction of a protruding direction of the support bar 24, the grooves 27 are also filled with the resin material as described above and thereby, the rear surfaces of the support bar 24 and die pad 23 are in a separated state. Therefore, when one of the rear surfaces of the support bar 24 and die pad 23 of the semiconductor device 1 fabricated are soldered to a printed wiring board, solder is prevented from flowing out to the other surface and therefore, a mechanical strength of a soldered joint is prevented from being reduced.

Furthermore, in a fabrication process for a semiconductor device 1 of the embodiment, since the lead frame 2 of the embodiment in which the grooves 27 are formed on the support bars 24 is used, the semiconductor device 1 can be fabricated that is excellent in level of exposure of the rear surface of the die pad 23. Further, when one of the rear surfaces of the support bar 24 and die pad 23 of the semiconductor device 1 are soldered to a printed wiring board, solder is prevented from flowing out to the other surface and therefore, the semiconductor device 1 in which a mechanical strength of a soldered joint is improved can be fabricated.

Hence, according to the lead frame 2, a semiconductor device 1 and a fabrication process for the device 1 of the present invention, a mechanical strength of a soldered joint can be improved when in mounting the semiconductor device 1 on a printed wiring board and reduction in capability of heat dissipation can be prevented from occurring, which in turn, enables fabrication of an electronic component with improved reliability and increased yield when using the semiconductor device 1.

It should be noted that while in the embodiment, description is made of the example in which grooves are formed on the rear surfaces of support bars of a lead frame, the grooves may respectively be formed on the front surfaces of the support bars. In this case as well, since a strain to deform a die pad, which is imposed by clamping by an encapsulating metal mold in the resin encapsulating step, can be decreased, there can be obtained an effect to improve a level of exposure of the die pad. Further, if the support bars can be provided with a strength enough to support the die pad, both surfaces of each support bar can respectively have grooves thereon.

Further, in the embodiment, description is made of an encapsulating metal mold that conducts encapsulation while a lead frame is disposed so that the rear surface of a die pad is put in plane contact with the top surface of a lower metal mold half: Contrary to the above description, of the lead frame is turned with an interchange in position between the front side and the rear side and thereby, the encapsulating metal mold may be used while the rear surface of the die pad is put in plane contact with the top surface of its upper metal mold half.

As described above, according to a lead frame of the invention a groove is formed on at least one of the front and rear surfaces of each support bar and with this groove formed, a strain that works so as to deform a die pad and that is imposed on the lead frame can be alleviated in a resin encapsulating step of semiconductor device fabrication. Therefore, a resin-encapsulated semiconductor device can be a reality in which the rear surface of the die pad is exposed to the external environment and in which a level of exposure of the rear surface is improved. Further, since a groove on a support bar is formed so that the groove traverses the support bar along an intersecting direction of a direction in which the support bar protrudes, if the groove is formed on the rear surface of a support bar, solder is prevented from flowing out from one of the rear surfaces of a die pad and support bar of the semiconductor device, in which the rear surface of the die pad is exposed to the external environment and that is fabricated using a lead frame of the present invention, to the other when the one of the rear surfaces of a die pad and support bar of the semiconductor device is soldered on a printed wiring board.

Further, in a resin-encapsulated semiconductor device according to the invention, a groove is formed on a support bar similar to the above described invention and therefore, deformation of the die pad can be prevented from occurring in the resin sealing step of the fabrication and in addition, a resin-encapsulated semiconductor device in which the rear surface of the die pad is exposed to the external environment and which has an improved level of exposure can be realized. Further, since a groove is formed on a support bar similar to the main feature of the invention, if the groove is located on the rear surface of the support bar, solder can be prevented from flowing out from one of the rear surfaces of a die pad and support bar of the semiconductor device to the other when the one of the rear surfaces of a die pad and support bar is soldered onto a printed wiring board.

Further, in a fabrication process for a resin-encapsulated semiconductor device according to the invention, the semiconductor element and the periphery thereof are resin encapsulated using a lead frame of the invention while the rear surface of the die pad is exposed to the external environment. Therefore, there can be fabricated a resin-encapsulated semiconductor device in which the rear surface of the die pad is exposed to the external environment. Not only is a level of exposure of the rear surface of the die pad improved, but fabrication solder can be prevented from flowing out from one of the rear surfaces of a die pad and support bar of the semiconductor device as fabricated to the other when the one of the rear surfaces of a die pad and support bar is soldered onto a printed wiring board.

Hence, according to the aspects of the invention included, there can be realized a resin-encapsulated semiconductor device in which the rear surface of the die pad is exposed to the external environment, and which has a high mechanical strength of a soldered joint in mounting the device on a printed wiring board and is excellent in head dissipation.

What is claimed is:

1. A fabrication process for a resin-encapsulated semiconductor device in which a lead frame is employed, in which a die pad and a support bar protruding from a side of the die pad toward a frame selvage are provided in an opening inside the frame selvage, and in which a groove is formed on at least one of a front and rear surfaces of the support bar so that the groove traverses the support bar in a neighborhood of a boundary between the support bar and the die pad along a direction intersecting a protruding direction of the support bar, said fabrication process comprising the steps of:

placing a semiconductor element on a front surface of the die pad; and then, resin encapsulating the semiconductor element and a periphery thereof using an encapsulation metal mold while exposing a rear surface of the die pad to an external environment.

2. A lead frame comprising: a frame selvage provided with an opening; a die pad that is disposed in the opening and on whose front surface a semiconductor element is placed; a support bar that is provided in the opening while protruding from a side of the die pad toward the frame selvage, wherein a groove is formed on at least one of a front and rear surface of the support bar so that the groove traverses the support bar in a neighborhood of a boundary between the support bar and the die pad along a direction intersecting a protruding direction of the support bar.

3. A resin-encapsulated semiconductor device having a construction in which a semiconductor element is placed on a front surface of a die pad of a lead frame that includes a die pad and a support bar of the die pad which support bar protrudes outwardly from a side of the die pad, and the semiconductor element and a periphery thereof are encapsulated with a resin material while a rear surface of the die pad is exposed to an external environment, wherein a groove is formed on at least one of a front and rear surface of the support bar so that the groove traverses the support bar in a neighborhood of a boundary between the support bar and the die pad along a direction intersecting a protruding direction of the support bar.

4. A resin-encapsulated semiconductor device according to claim 3, wherein not only is the groove provided on the rear surface of the die pad, but the resin material is also filled inside the groove.

* * * * *